US008496488B2

(12) United States Patent
Grimm et al.

(10) Patent No.: US 8,496,488 B2
(45) Date of Patent: Jul. 30, 2013

(54) POWER INPUT TERMINAL BLOCK HOUSING AND COVER

(75) Inventors: Matthew Don Grimm, Leander, TX (US); Edward John Kliewer, Sunnyvale, CA (US); Kwok Keung Lee, Plano, TX (US); Sam David Blackwell, Round Rock, TX (US)

(73) Assignee: Cisco Technology, Inc., San Jose, CA (US)

( * ) Notice: Subject to any disclaimer, the term of this patent is extended or adjusted under 35 U.S.C. 154(b) by 83 days.

(21) Appl. No.: 13/070,705

(22) Filed: Mar. 24, 2011

(65) Prior Publication Data

US 2012/0244730 A1    Sep. 27, 2012

(51) Int. Cl.
*H01R 13/44* (2006.01)
(52) U.S. Cl.
USPC ............ 439/144; 439/467; 439/564; 439/716
(58) Field of Classification Search
USPC ................. 439/144, 142, 147, 460, 465–468, 439/470, 473, 564, 567, 709, 712, 715, 716
See application file for complete search history.

(56) References Cited

U.S. PATENT DOCUMENTS

| | | | | |
|---|---|---|---|---|
| 5,389,740 A * | 2/1995 | Austin | ........................... | 439/147 |
| 5,430,248 A | 7/1995 | Levy | ............................... | 174/50 |
| 5,800,028 A | 9/1998 | Smith et al. | ................. | 312/223.1 |
| 6,176,747 B1 * | 1/2001 | Rowe et al. | .................... | 439/701 |
| 7,277,295 B2 | 10/2007 | Zimmerman et al. | ........ | 361/752 |
| 7,467,966 B2 * | 12/2008 | Pizzi | .............................. | 439/441 |
| 7,534,148 B2 | 5/2009 | Schuttler et al. | .............. | 439/709 |
| 7,985,094 B2 * | 7/2011 | Dennes et al. | ................ | 439/409 |
| 2005/0233649 A1 | 10/2005 | Siracki et al. | ................. | 439/721 |

OTHER PUBLICATIONS

Thermoplastic Power Blocks with Hinge Covers Attached (CH), Mar. 7, 2006, pp. 1-2, www.marathonsp.com.

* cited by examiner

*Primary Examiner* — Felix O Figueroa
(74) *Attorney, Agent, or Firm* — Brinks Hofer Gilson & Lione

(57) ABSTRACT

An apparatus includes a housing and a cover. The housing can include a surface to receive a terminal block to transmit power to an electrical component. A shroud to be inserted within the electrical component can extend away from the housing surface. The cover can have an end for hingedly attaching to the housing. Another cover end can be configured to releasably lock to the housing. The housing and the cover can have notches. The cover is pivotable relative to the housing between a closed position and an open position. In the closed position, the cover and the housing together form an enclosure for the terminal block, and the notches of the housing and the cover cooperatively define passageways configured to receive external wires to connect to the terminal block.

16 Claims, 14 Drawing Sheets

POWER INPUT TERMINAL BLOCK HOUSING AND COVER

FIELD

The present embodiments relate to a power input terminal block housing and cover for an electrical hardware component.

BACKGROUND

Electronic systems, such as computer servers, routers, switches, blade servers, or any other computing devices, include power terminal blocks to facilitate connection between two groups of wires, for example, internal system power wires and external power wires. The power terminal block is typically mounted to a support structure that includes a mounting plate and a removable lid coupled to a standoff portion on the mounting plate. The power terminal block may have three or more terminals for power: neutral, live, and ground. Multiple end users may need to access the power terminal block. Therefore, several power safety spacing and physical security requirements have been set forth in standards, such as various Underwriters Laboratories Inc. (UL) and International Electrotechnical Commission (IEC) standards, to prevent accidental and/or intentional touching and probing of the power terminal block.

The electronic systems can be rack-mounted units for a computer server rack, which is typically sized to dimensional standards as set forth by the Electronic Industries Alliance (EIA). The EIA has defined the mounting equipment in terms of a rack unit (RU), where each RU is 1.75" in height and 19.25" in width. Consequently, the total footprint of the housing for the power terminal block can be confined to the size of the electronic system. Thus, a housing and a lid for a power terminal block, which can meet several stringent power safety spacing and physical security requirements, as well as support a wide range of power input options, that are sized with a mounting footprint to fit to an electronic system, such as one having a 1RU size, is a challenge facing industrial designers.

DETAILED DESCRIPTION OF THE DRAWINGS

Overview

Figure 1:
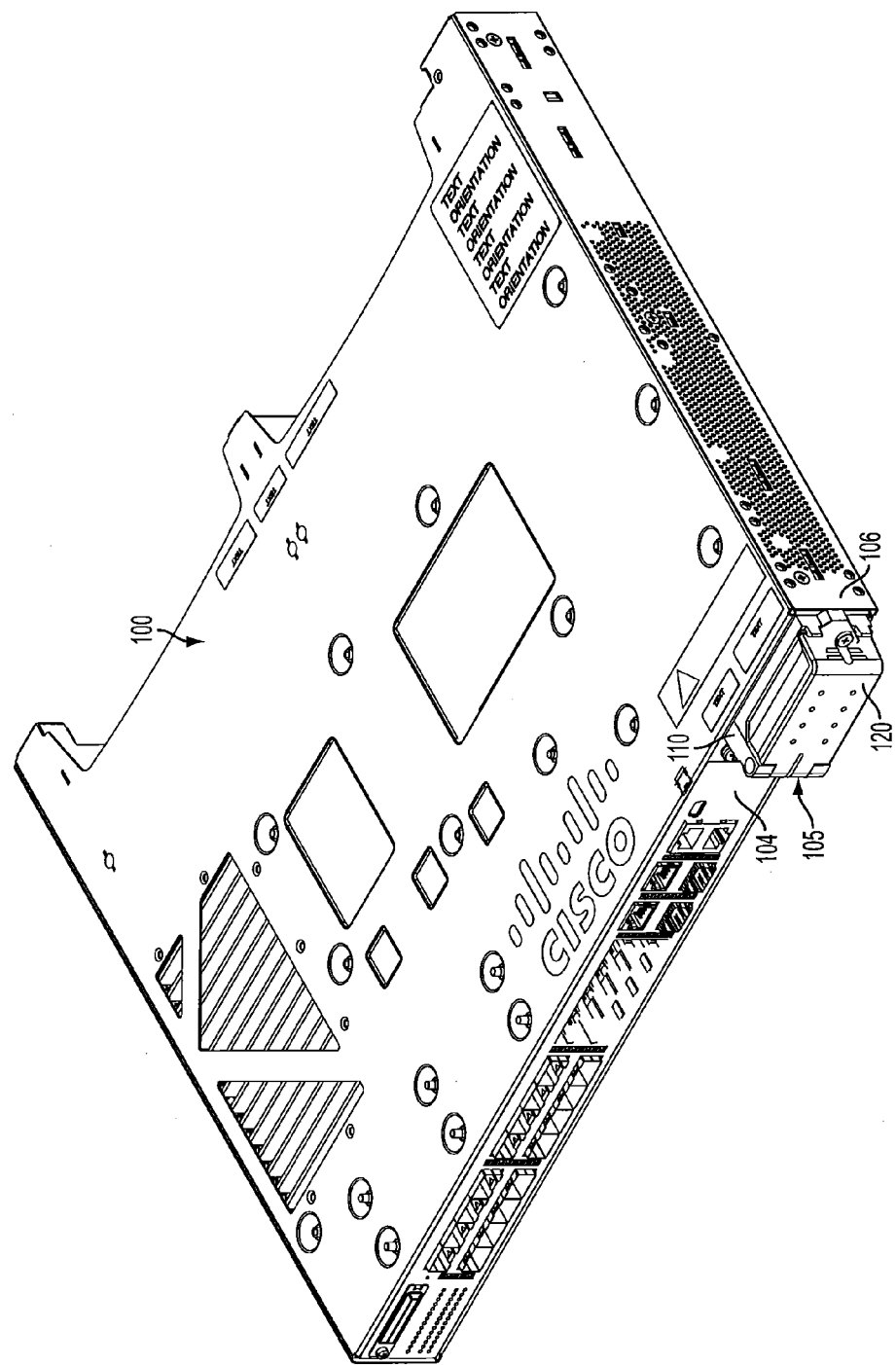
FIG. 1 illustrates a top perspective view of one embodiment of a terminal block system mounted to an electrical component.

In one embodiment, an apparatus includes a housing and a cover. The housing can have a first housing surface and a second housing surface, opposite to the first housing surface. The first housing surface can be configured to receive a terminal block to transmit power to an electrical component. A housing sidewall can extend away from the first housing surface. At least one first notch can be formed in the housing sidewall. A shroud can extend away from the second housing surface. The shroud can be configured to be inserted within the electrical component. The cover can have a first cover surface and a second cover surface, opposite the first cover surface, to face the first housing surface. A cover sidewall can extend away from the second cover surface, and at least one second notch can be formed in the cover sidewall. The cover is configured to hingedly attach to the housing so that the cover is movable relative to the housing between a closed position and an open position. In the closed position, the cover and the housing together can form an enclosure for the terminal block, and the at least one first notch and the at least one second notch can define at least one passageway configured to receive at least one external wire to connect to the terminal block.

In another embodiment, a system can include an electrical component requiring power, a terminal block, a housing, and a cover. The electrical component can have a chassis with chassis sidewalls situated to define a cavity. One of the chassis sidewalls can have a cutout formed therein. The terminal block can have at least one first electrical port, and at least one second electrical port in electrical communication with the at least one first electrical port. The housing can have a first housing surface, a second housing surface, opposite to the first housing surface to contact the chassis sidewall. At least one terminal block opening can extend between the first housing surface and the second housing surface. A shroud can extend away from the second housing surface. The terminal block can be coupled to the first housing surface and has portions extending through the at least one terminal block opening so that the at least one second electrical port is encompassed by the shroud. The shroud can be extended within the cutout of the electrical component into the cavity of the electrical component. The cover can have a first cover surface and a second cover surface to face the first housing surface. The cover can be configured to hingedly attach to the housing so that the cover is movable between a closed position and an open position. In the closed position, the cover and the housing together form an enclosure for the terminal block.

In yet another embodiment, a method can include inserting a shroud of a housing into a housing cutout formed in a chassis sidewall of an electrical component. The housing can be coupled to a terminal block. The terminal block can have first electrical ports extending away from the electrical component, and second electrical ports extending within the cavity of the electrical component. The shroud can be configured to surround the second electrical ports. A fastener bore can be formed within the housing. The housing can be moved within the housing cutout in a direction to align the fastener bore with an aperture formed in the chassis sidewall. The housing can be coupled to the electrical component by insertion of a retainer fastener through the fastener bore and the aperture. A cover can be hingedly attached to the housing. The cover can be movable between an open position and a closed position. In the closed position, the cover and the housing can be configured to provide a protective enclosure for the terminal block.

Example Embodiments

FIG. 1 illustrates a perspective view of one embodiment of an electrical component 100 requiring power to be operable. The electrical component 100 can be computer equipment such as a computer server, a router, a switch, a blade server, or any other computing device. One exemplary electrical component is the CGS Series 2520 switch, which is commercially available from Cisco Systems Inc. (San Jose, Calif.). The electrical component 100 can be a rack-mounted unit for a computer server rack, which is typically sized to dimensional standards as set forth by the Electronic Industries Alliance (EIA). The EIA has defined the mounting equipment in terms of a rack unit (RU), where each RU is 1.75" in height and 19.25" in width. A terminal block system 105 can be mounted to the electrical component 100 to facilitate connection between internal system power wires and external power wires. The terminal block system 105 can include a main housing 110 coupled to a chassis sidewall 104 of the chassis 106 of the electrical component 100 and a cover 120 which is shown in a closed position. As will be explained, the main housing 110 includes a first portion that is accessible external to the electrical component 100 and a second portion that is accessible internal within a cavity 107 of the electrical component 100 when mounted to the electrical component.

Figure 2:
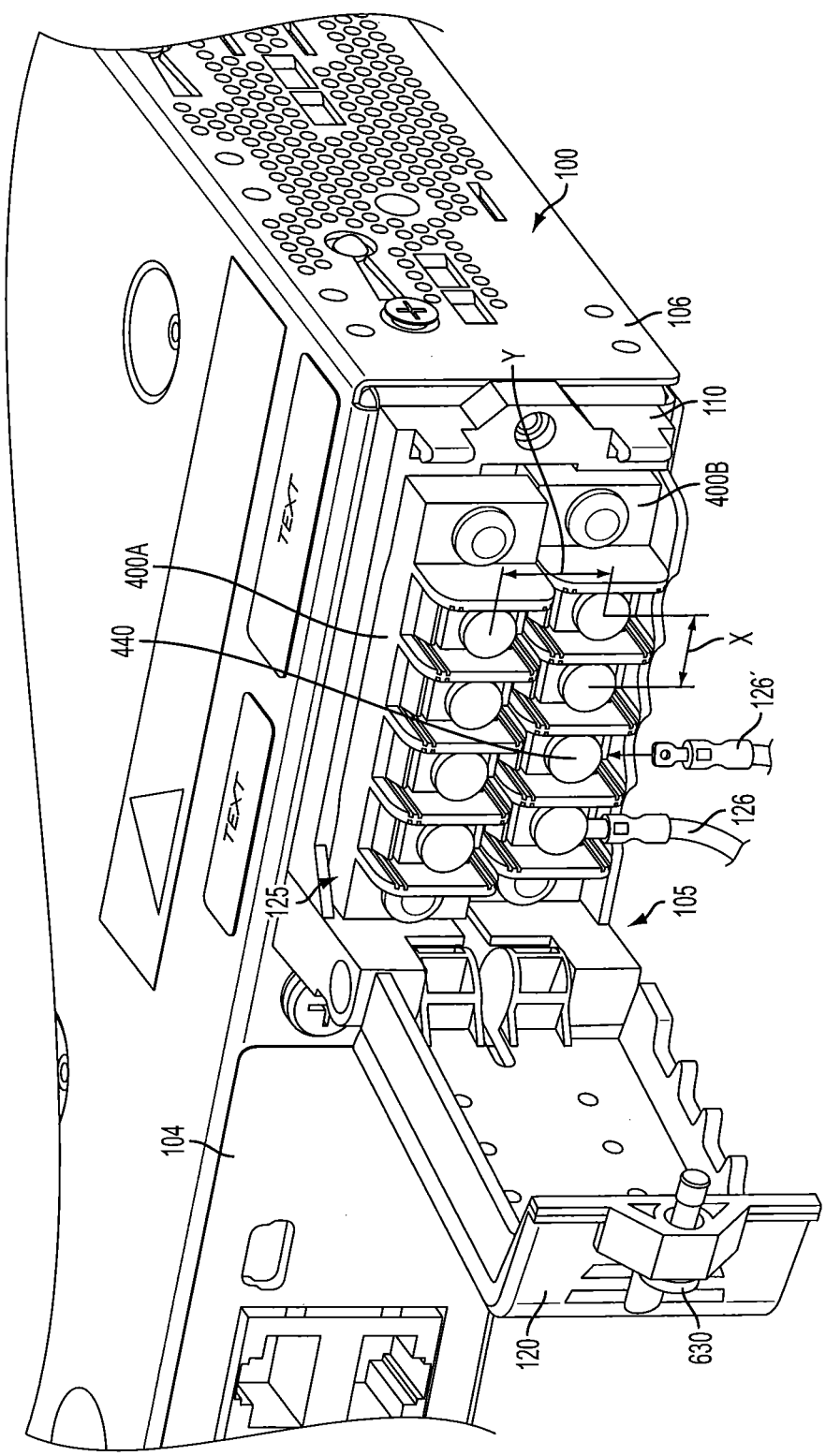
FIG. 2 illustrates a top perspective view of one embodiment of the terminal block system of FIG. 1 with a cover in an open position.
Figure 3:
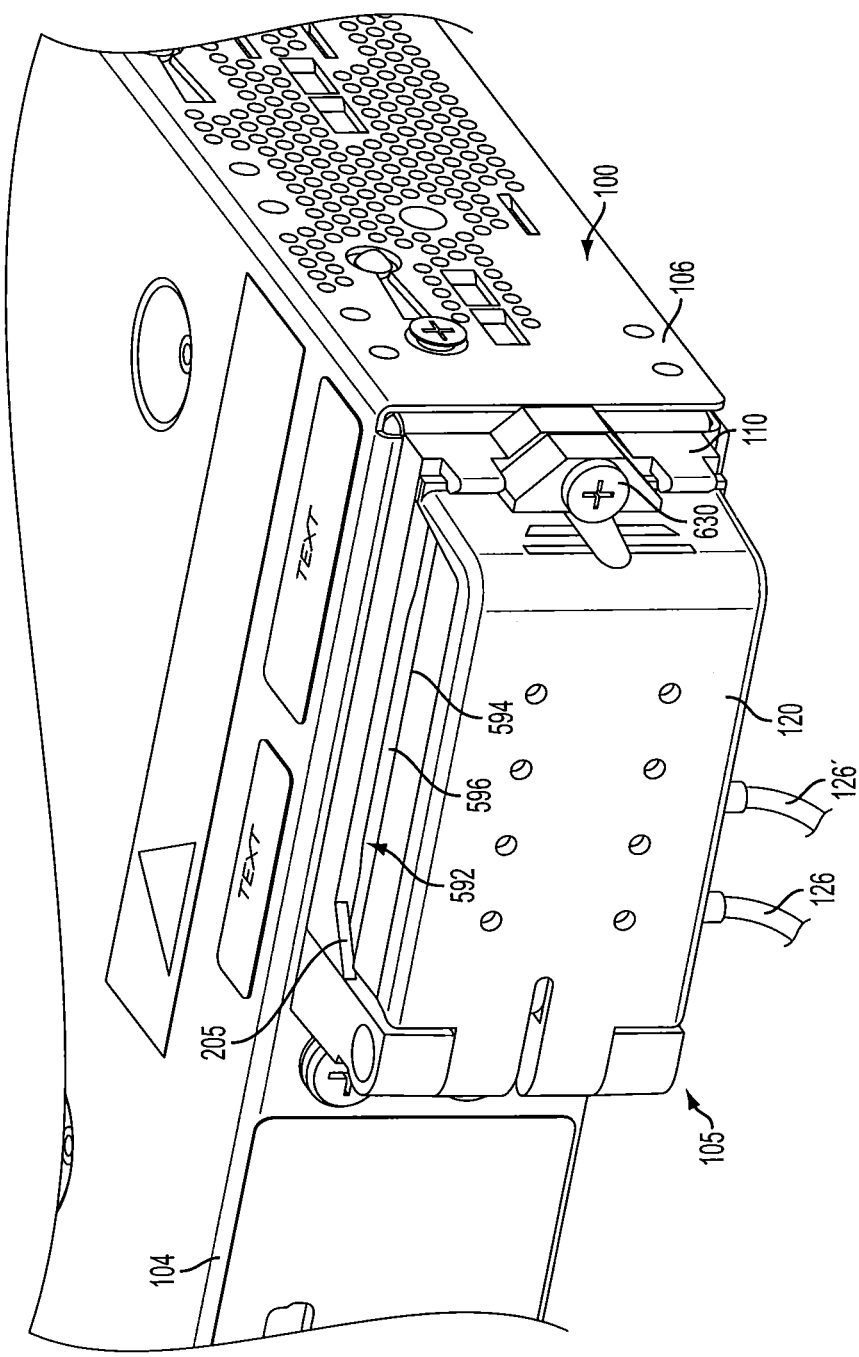
FIG. 3 illustrates a top perspective view of one embodiment of the terminal block system of FIG. 1 with a cover in a closed position.

FIGS. 2 and 3 illustrate partial perspective views of the terminal block system 105. In FIG. 2, the cover 120 is in an open position to provide external access to a terminal bock 125 that is coupled to the main housing 110. In FIG. 3, the cover 120 is the closed position to substantially prevent external access to the terminal block 125 in accordance with several power safety spacing and physical security requirements as set forth in standards, such as various UL and IEC standards. FIG. 2 illustrates one external power wire 126 coupled to the terminal block 125, and another external power wire 126' about to be coupled to the terminal block 125.

Figure 4A:
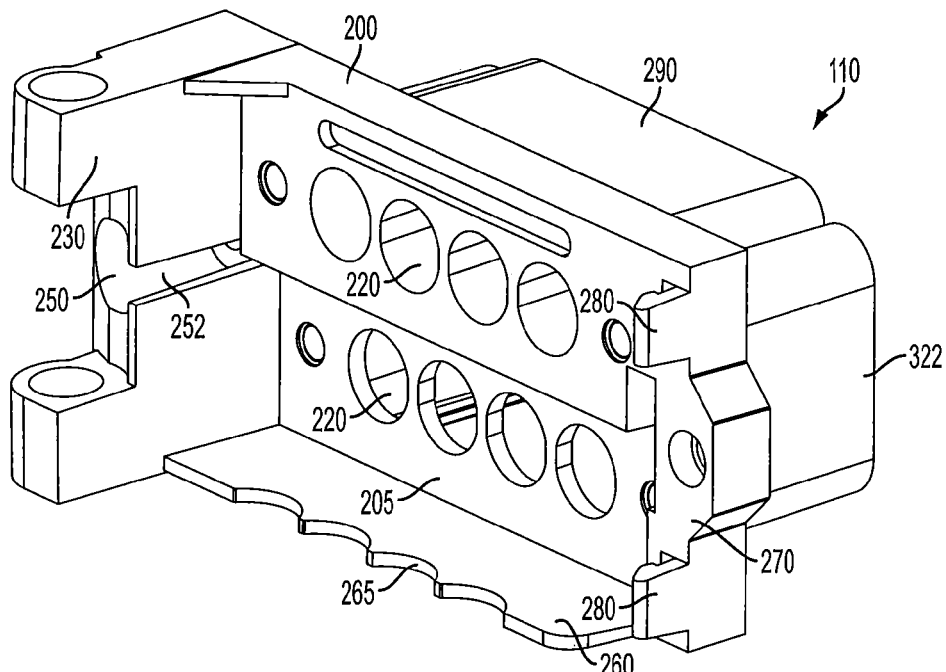
FIGS. 4A-4B illustrate perspective views of one embodiment of a main housing of one embodiment of the terminal block system of FIG. 1.
Figure 4B:
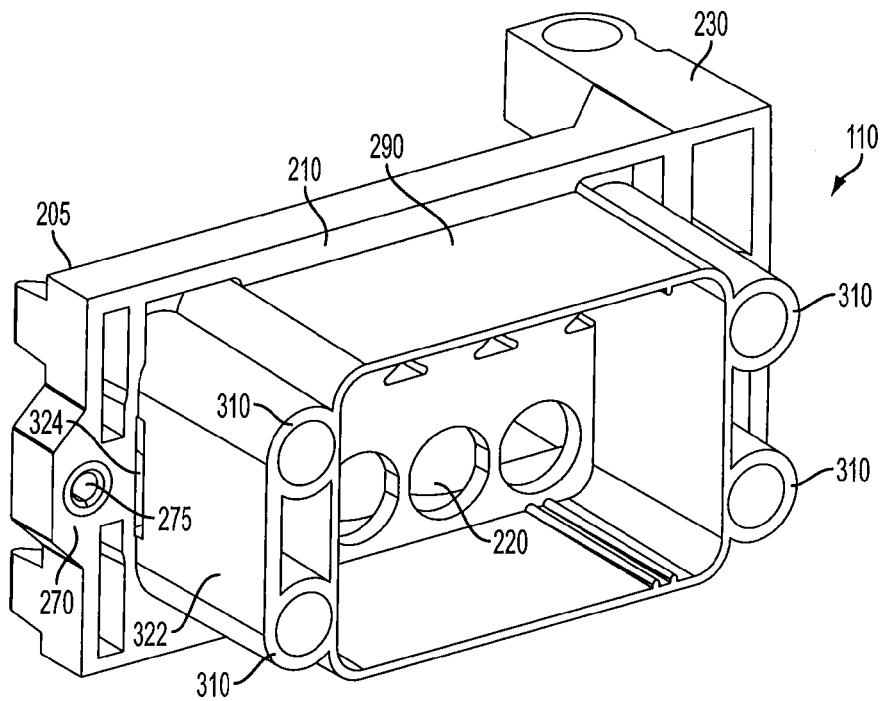

FIGS. 4A-4B are perspective views of the main housing 110 of the terminal block system 105. FIGS. 5, 6, 7, and 8 are front, top, side, rear views, respectively, of the main housing 110 in FIGS. 4A-4B. The main housing 110 can have a housing body 200 formed in the shape of plate that is shown in the figures as extending longitudinally to form a substantially planar surface, such as a vertical direction. The housing body 200 includes a first housing surface 205 that is accessible external to the electrical component 100 and a second housing surface 210, opposite the first housing surface 205, to be a confronting relationship with the external surface of the chassis sidewall 104 of the electrical component 100. The first and second housing surfaces 205, 210 can be separated by a web thickness. The general shape of the housing body 200 can be many shapes. In one example, a portion of the housing body is rectangular. The housing body 200 can have a first housing end 212 and a second housing end 214, opposite the first housing end 212, and a third housing end 216 and a fourth housing end 218, opposite the third housing end 216. The first and second housing ends generally make up the sides, e.g., the vertical sides, that are associated with the height of the main housing, while the third and fourth housing ends generally make up the sides, e.g., the horizontal sides, that are associated with the width of the main housing.

Figure 5:
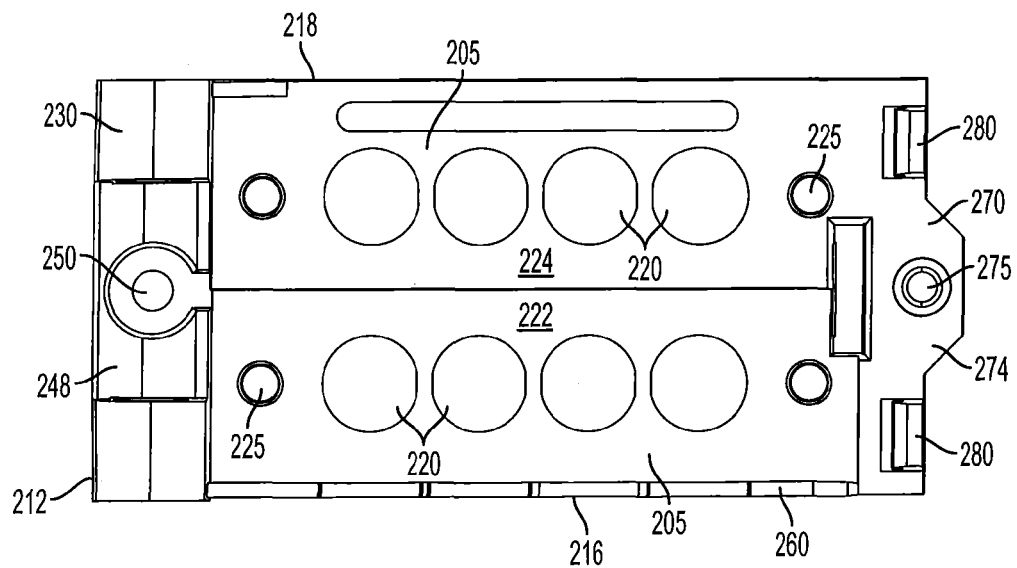
FIG. 5 illustrates a front view of one embodiment of the main housing of FIG. 4A.
Figure 6:
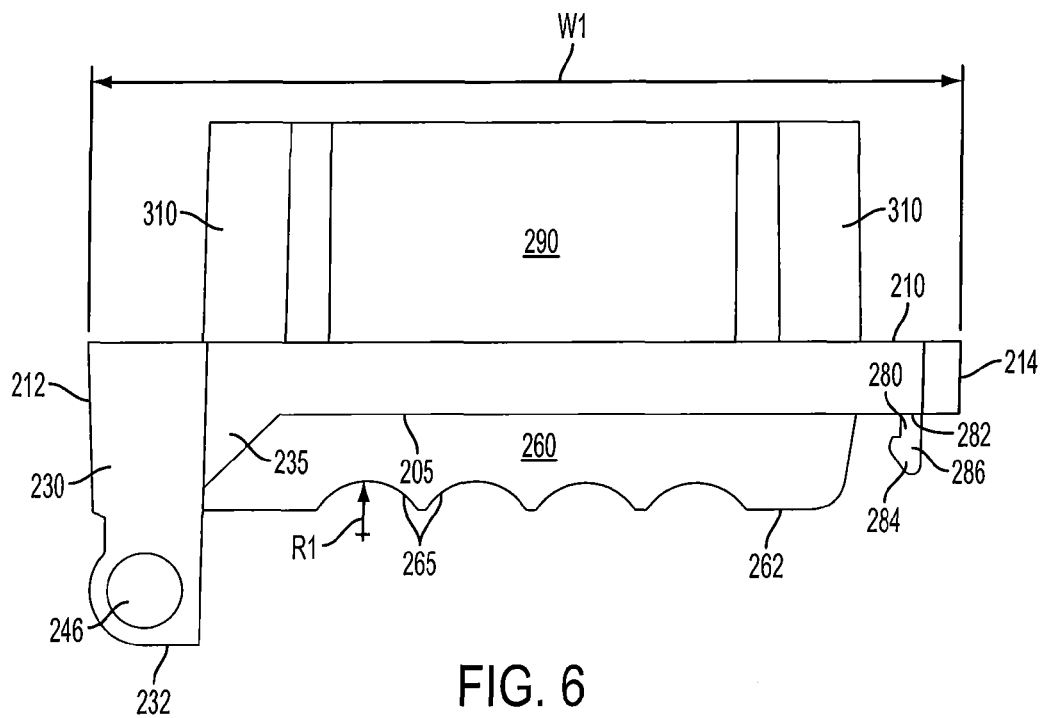
FIG. 6 illustrates a top view of one embodiment of the main housing of FIG. 4A.
Figure 8:
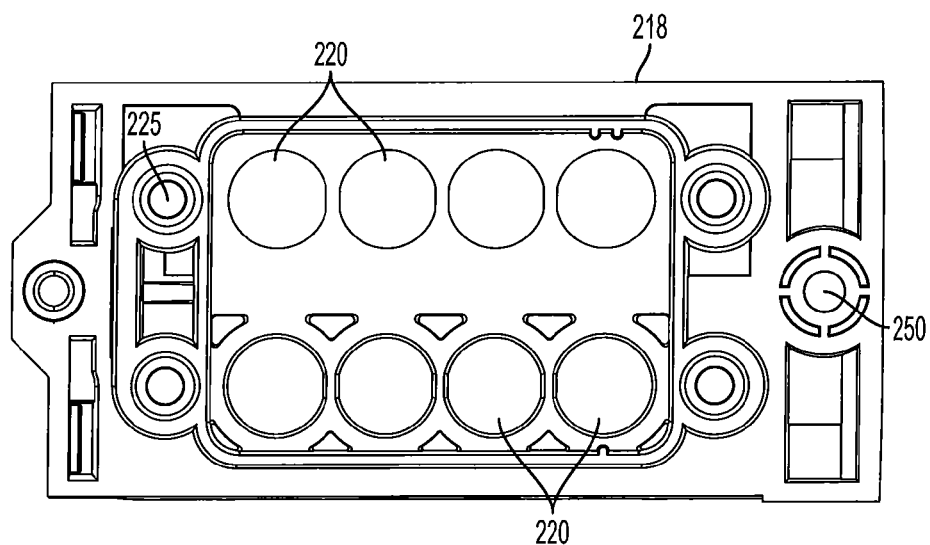
FIG. 8 illustrates a rear view of one embodiment of the main housing of FIG. 4A.

One or more terminal block openings 220 (e.g., eight terminal block openings shown) can be formed in the housing body 200, extending between the first and second housing surfaces 205, 210 of the housing body 200, as shown in FIGS. 5 and 8. The terminal block openings 220 can be configured to permit portions of the terminal block 125 to pass through the housing body to the cavity of the electrical component to isolate the first and second electrical ports of the terminal block. In one example, the terminal block openings 220 can be configured to isolate each of the pass-through terminal blocks within a chamber that can be isolated from adjacent chambers. It is contemplated that a single terminal block opening may be used to pass through multiple portions of the terminal block. A plurality of first fastener openings 225 (e.g., four first fastener openings shown) can be formed in the housing body 200, extending between the first and second housing surfaces 205, 210 of the housing body 200. The first fastener openings 220 are configured to receive terminal block fasteners 221 (FIG. 19), such as screws, rivets, or other mechanical fasteners, for secure attachment between the terminal block 125 and the main housing 110. The terminal block may be attached to the main housing by any other attachment mechanisms, such as adhesives, welding, soldering, or the like.

The first housing surface 205 can be offset such that a portion 222 of the first housing surface 205 is recessed from an adjacent portion 224. In one example, the recessed portion 222 of the first housing surface 205 can be disposed along the third housing end 216, and the adjacent portion 224 can be disposed along the fourth housing end 218. In another example, the recessed portion 222 of the first housing surface 205 can be disposed along the fourth housing end 218, and the adjacent portion 224 can be disposed along the third housing end 216. The recessed portion 222 and adjacent portion 224 can be in substantial alignment with the respective third and fourth housing ends 216, 218. A first set of terminal block openings can be arranged along and associated with the recessed portion 222 of the surface 230, and a second set of terminal block openings can be arranged along and associated with the adjacent portion 224. The terminal block openings in each set can be in horizontal alignment with one another. The first fastener openings can be disposed outside the first and second sets of terminal block openings, and may also be in horizontal alignment with the respective terminal block openings. Although each of the first and second sets of terminal block openings is shown including a total of four openings (2 rows×4 openings), any number of rows and/or openings may be included depending on the configuration of the terminal block, such as, for example, (2 rows×3 openings) or (2 rows×6 openings).

A first housing sidewall 230 can extend outward away from the first housing surface 205 along the first housing end 212. The height of the first housing sidewall 230 can be sized to extend vertically between the third and fourth housing ends. A gusset 235 can be included between the first housing surface 205 and the first housing sidewall 230 for additional structural support. The gusset 235 can be placed along the fourth housing end 218.

Figure 7:
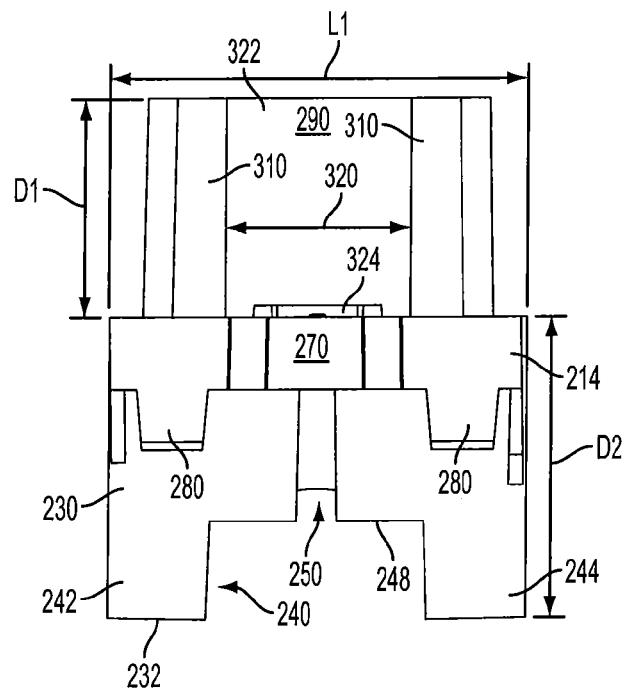
FIG. 7 illustrates a side view of one embodiment of the main housing of FIG. 4A.

FIG. 7 illustrates an indentation 240 that can be formed in a first end 232 of the first housing sidewall 230, and at least partially extending between the first end 232 and the first housing surface 205. The indentation 240 may be centrally located between the third and fourth housing ends 216 and 218 of the housing body 200 to form a first ear portion 242 and a second ear portion 244 surrounding the indentation 240. In one example, the indentation 240 is rectangular in cross-sectional shape. The first and second ear portions 242, 244 each may include a hinge bore 246 extending in a general direction of the third and fourth housing ends 216, 218, i.e., extending vertically. The hinge bores 246 can be in communication with the indentation 240. The indentation 240 can form a recessed surface 248 in the first end 232 of the first housing sidewall 230 between the first and second ear portions 242, 244. FIG. 5 illustrates a fastener bore 250 that can be formed in the recessed surface 248 to extend horizontally through the second housing surface 210. The fastener bore 250 is configured to receive a retainer fastener 251 (FIG. 19) for securely attaching the main housing 110 to the electrical component 100. In FIG. 4A, the fastener bore 250 can be sized such that a solid wall is formed along the outside of the first housing sidewall 230, and a longitudinal slot 252 is formed along an inner wall 254 of the first housing sidewall 230.

A second housing sidewall 260 can extend outward away from the first housing surface 205 along the third housing end 216. The width of the second housing sidewall 260 can be sized to extend horizontally at least partially between the first housing sidewall 230 and the second housing end 214 of the body. The length of extension of the second housing sidewall 260 may be less than the extension length of the first housing sidewall 230. A plurality of first notches 265 (e.g., four first notches) can be formed in a first end 262 of the second housing sidewall 260. The first notches 265 may have arcuate portions 266, such as half moons, having a first radius of curvature R1. Each of the first notches 265 can be situated in alignment below a corresponding termination port of the terminal block. For example, one of the first notches can be in vertical alignment with one of the terminal block openings of the first set and one of the terminal block openings of the second set.

A first tongue member 270 can protrude laterally outward away from the second housing end 214. The first tongue member 270 can have a first confronting surface 272 that is coextensive with the first housing surface 205 and a second confronting surface 274 that is coextensive with the second housing surface 210. A first locking bore 275 can be formed in an intermediate portion of the first tongue member 270, and can extend between the first and second confronting surfaces 272, 274. The first locking bore 275 is configured to receive a locking fastener, e.g., the locking fastener 630 in FIG. 12, for secure attachment with the cover 120 when in the closed position. A nut, such as a locking PEM nut, can be inserted within the first locking bore 275. The nut is configured to threadably receive an end of the locking fastener and prevent the locking fastener from backing out of the nut easily. The cover in the closed position can be secured to the housing so that the cover can be released from the closed position with a single tool to loosen the locking fastener. One or more snap tang retainers 280 can be included along the second housing end 214. The retainer 280 can extend outward away from the first housing surface 205. The retainer 280 can have a base 282 coupled to the housing body 200, an engaging tip 284, and a resilient body 286 in between the base 282 and the tip 284. The retainer 280 is configured for releasable engagement with a portion of the cover 120. In one example, the retainer may be included, instead of the locking fastener, on the main housing to retain the cover in the closed position. However, when security safety standards require tool only access, the locking fastener, in addition to or instead of the retainers, can be provided to meet such standard.

Figure 9:
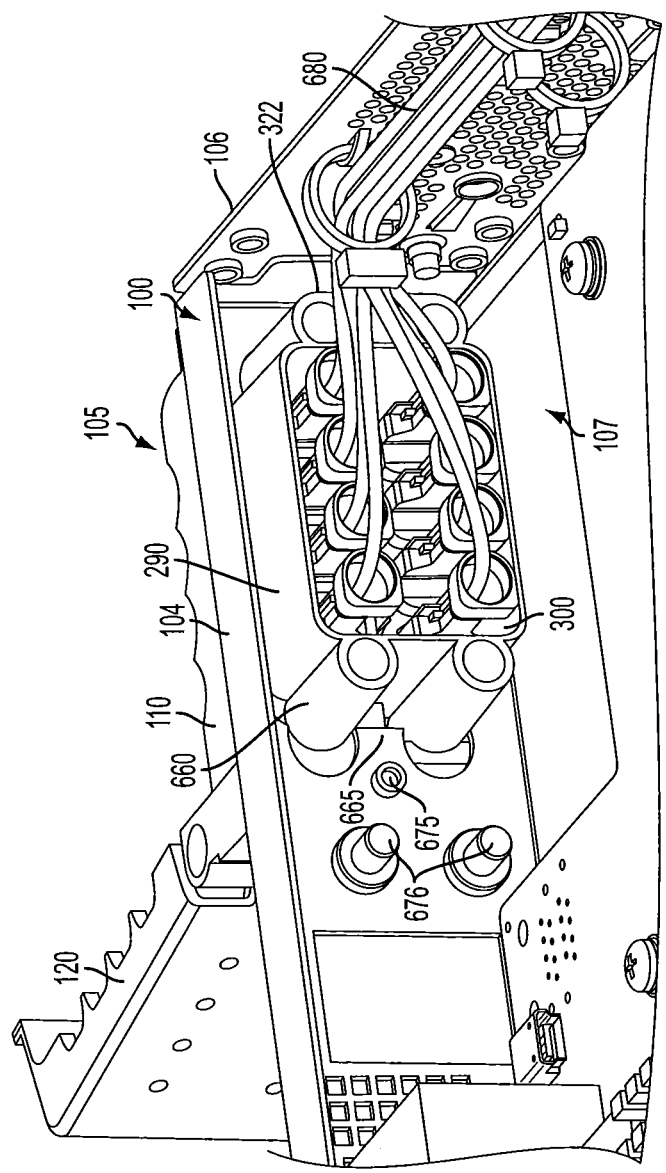
FIG. 9 illustrates a rear perspective view of one embodiment of the terminal block system of FIG. 1 with a cover in an open position.

FIGS. 8 and 9 illustrate a rear view of the main housing 110. According to FIGS. 6, 7, 8, and 9, the main housing 110 can have a shroud 290 extending outward from the second surface of the housing body 200, which can be extending generally transverse to the housing body 200. The shroud 290 can include shroud sidewalls 295 of a wall thickness that are arranged to define a chamber 300. The shroud 290 is configured for isolating one end of the terminal block 125 as will be explained. In one example, the shroud sidewalls 295 generally form a rectangular shape, i.e., pairs of vertical and horizontal sidewalls. The chamber 300 can be in communication with the terminal block openings 220. The shroud 290 can be situated along the second housing surface 210 to be offset from one or more of the first, second, third, and fourth housing ends 212, 214, 216, 218 to increase the amount of surface area contact between the second housing surface 210 and the external surface of the chassis sidewall 104 of the electrical component 100. FIG. 8 illustrates that the shroud 290 can be centrally located along the second housing surface 210 so that the shroud is offset from all of the first, second, third, and fourth ends. The location of the shroud 290 can correspond to the location of the terminal block openings 220 such that the chamber 300 is in communication with all of the terminal block openings 220.

FIG. 8 illustrates a plurality of tubular members 310 (e.g., four tubular members) can extend outward from the second housing surface 210, which can be extending generally transverse to the housing body 200. The tubular members 310 can be located at positions to correspond to the location of the first fastener openings 225 such that lumens 315 of the tubular members 310 are in communication with the first fastener openings 225. The tubular members can provide an isolation wall around the terminal block fasteners when metal fasteners are used. The tubular members 310 can be disposed along the shroud sidewalls 295. Two pairs of tubular members can be disposed along opposite shroud sidewalls, e.g., the shroud sidewalls that generally correspond to the first and second housing ends 212, 214. Each tubular member of the pair may be spaced, e.g., vertically spaced, from one another by a gap 320. The tubular members 310 can extend from the second housing surface 210 by a distance that is coextensive with the distance of the shroud. FIG. 8 illustrates that a connecting wall 322 may be located between two tubular members to bridge the gap 320. FIG. 7 illustrates that an opening 324 may be formed in the connecting wall 322. The opening 324 can be configured to receive a locking tab from the chassis sidewall when the housing is repositioned within the cutout of the chassis sidewall. The opening 324 can be adjacent the second housing surface 210. It is contemplated that the connecting wall with the opening can be formed along the opposite side of the shroud.

Figure 10:
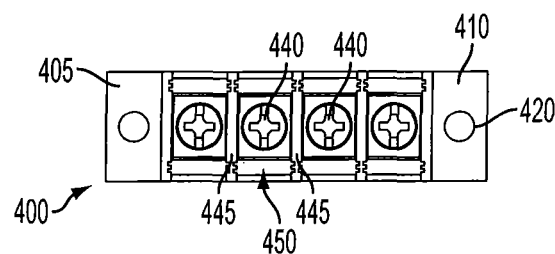
FIG. 10 illustrates a front view of one embodiment of a terminal block segment of a terminal block of one embodiment of the terminal block system of FIG. 1.
Figure 11:
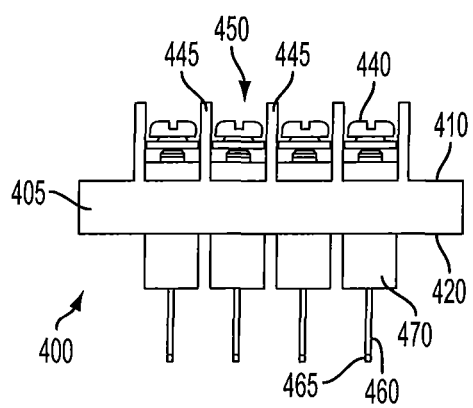
FIG. 11 illustrates a bottom view of one embodiment of the terminal block segment of FIG. 10.
Figure 12:
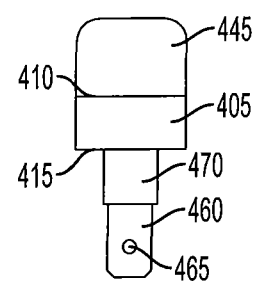
FIG. 12 illustrates a side view of one embodiment of the terminal block segment of FIG. 10.

The terminal block 125 can have a variety of configurations. For example, the terminal block can be segmented. FIGS. 10, 11, and 12 illustrate one example of a segment 400 of the terminal block 125, which can form the two terminal block segments 400A, 400B shown in FIG. 2. The terminal block segment 400 is commercially available from Tyco Electronics (Berwyn, Pa.). The terminal block segment 400 can include a segment body 405 having a first surface 410 and a second surface 415, opposite to the first surface 410, for confronting the first housing surface 205. A plurality of second fastener openings 420 can extend between the first and second surfaces 410, 415 of the segment body 405. The second fastener openings 420 can be sized and disposed to be in alignment with the location of corresponding first fastener openings 225 of the housing body 200. Terminal block fasteners 221 (shown in FIG. 2) can be inserted within the second fastener openings 420 and the first fastener openings 225 and tightened to secure the terminal block segments 400 to the corresponding portion of the main housing 110. The end of the fastener can be inserted within the tubular member 310 to isolate with from the electrical component.

In FIG. 10, along the first surface 410 of the terminal block segment 400 is a plurality of first electrical ports 440 that are configured to securely receive external power wires 126 external to the electrical component 100. Although the terminal block segment 400 is shown including a total of four electrical ports (1 row×4 ports), any number of rows and/or ports may be included, such as, for example, (1 rows×3 ports) or (1 rows×6 ports). It is further contemplated that the terminal block 125 can be configured without segments such that the terminal block 125 is configured to include two or more rows, such as, e.g., eight electrical ports (2 rows×4 ports). Each first electrical ports 440 can be isolated from one another by walls 445 that form a stall 450 around each of the first electrical ports 440. The first electrical ports on a single terminal block can be spaced laterally from one another by a distance X (FIG. 2) suitable for safety, which can depend on the voltage and type of power. For example, the distance X can be at least about 0.25 inches (6.27 mm) to separate the VAC hot and neutral, and preferably at least about 0.375 inches (9.55 mm). The first electrical ports can be mechanical wire screw lugs, or any mechanical fastener that permits a wire to be crimped, screwed, plugged, or otherwise fastened to the mechanical fastener.

In FIGS. 11 and 12, the second surface 410 of the terminal block segment 400 can be configured to be flush with the first housing surface. Extending from the second surface 410 of the terminal block segment 400 is a plurality of second electrical ports 460 that are configured to securely receive power wires internally within the electrical component 100. Each second electrical port 460 is in electrical communication with one of the first electrical ports 440. The second electrical ports 460 can include a connector end 465 such as a ring terminal, spade terminal or a flanged spade terminal, or any mechanical fastener, including either male or female connectors, which permits a wire to be crimped, screwed, plugged, or otherwise fastened to the mechanical fastener. The connector end 465 can extend from a post 470. The post has an outer circumference that can be sized to slidably engage with the terminal block opening 220 of the housing body 200. The first and second electrical ports can made of electrically conductive materials, such as copper, copper alloys, or other metals and/or metal alloys.

In FIG. 2, the first electrical ports of the terminal block segment 400A can be spaced vertically from the first electrical ports of the terminal block segment 400B by a distance Y suitable for safety, which can depend on the voltage and type of power. For example, the distance Y can be at least about 0.5 inches (12.54 mm) to separate the high VAC hot/neutral and low VDC, and more preferably at least 0.64 inches (16.25 mm). The terminal block segment 400A can be coupled to the adjacent surface 224 of the housing body 200 of the main housing 110, while the terminal block segment 400B can be coupled to the recessed surface 222 to offset the terminal block segments from one another. The degree of offset can provide the terminal block segment 400A slightly farther out than the terminal block segment 400B so that when wiring to terminal block segment 400A the external wires 126 can lay substantially flat along the terminal block segment 400B, without a bend in the wire, to exit straight out the passageways defined by the notches. In one example, the offset distance is at least about 0.19 inches (5 mm). The offsetting terminal block segments can further isolate the high voltage terminations from the low voltage terminations for power safety spacing clearances, when both types of power are included. To attach each terminal block segment to the main housing 110, the post 470 of each of the second electrical ports 460 are aligned with and slidably inserted within the corresponding terminal block openings 220 so that the second surface 415 of the terminal block segment 400 is flush with the first housing surface 205. In this position, at least the connector ends 465 of the second electrical ports 460 are extended within the chamber 300 of the shroud 290, as shown in FIG. 9. The shroud sidewalls 295 can extend farther from the second housing surface 210 than the end location of the second electrical connectors in order to form a protective housing for the second electrical connectors. For example, the shroud 290 may extend up to about 0.25 inches to about 0.5 inches beyond the connector ends 465. To this end, the shroud sidewalls and the second housing surface are configured to structurally protect and electrically isolate the connector ends 465 of the second electrical probes from any other metal portions of the electrical component. In one example, the extension length of the shroud away from the second housing surface is about 0.75 inches. Each of the terminal block fasteners 221 is then inserted within corresponding first and second fastener openings 225, 420 and tubular member 310 to securely fasten each terminal block segment 400 to the main housing 110.

The terminal block 125 can be configured for multiple power input configurations, including arrangements for low DC voltage (about 24 VDC to about 60 VDC @ 10 A), for high DC voltage (about 100 VDC to about 250 VDC @ 2 A), and/or high AC voltage (about 100 VAC to about 240 VAC @ 2 A). The example voltages are exemplary only, and it is contemplated that voltages outside the aforementioned ranges may be included. One of the terminal block segments 400A or 400B can be operative to receive high AC or DC voltage, while other of the terminal block segments 400A or 400B can be operative to receive low DC voltage. The terminal block 125 can be configured for dual-power input configurations. For example, when the terminal block segment 400 includes four first electrical ports as shown in FIG. 2, two adjacent ports, e.g., on the left, can be configured for primary power input, while the other two adjacent ports, e.g., on the right, can be configured for emergency backup power input in case the primary power input is shutoff. In one example where the terminal block is configured for both redundant power input and high and low power input, two adjacent first electrical ports, e.g., on the left, of the terminal block segment 400A can be operative to receive high AC voltage for primary power input. Further, two adjacent first electrical ports, e.g., on the right, of the terminal block segment 400B can be operative to receive low DC voltage for emergency backup power input. All of the ports may be used for power input. In one example, the terminal block is configured to transmit power with an input voltage of one or more of the following: about 24 VDC to about 60 VDC; about 100 VDC to about 250 VDC; about 100 VAC to about 240 VAC; or any combination thereof, including a dual-power option having a VAC-VAC configuration, a VAC-VDC configuration, or a VDC-VDC configuration.

Figure 13A:
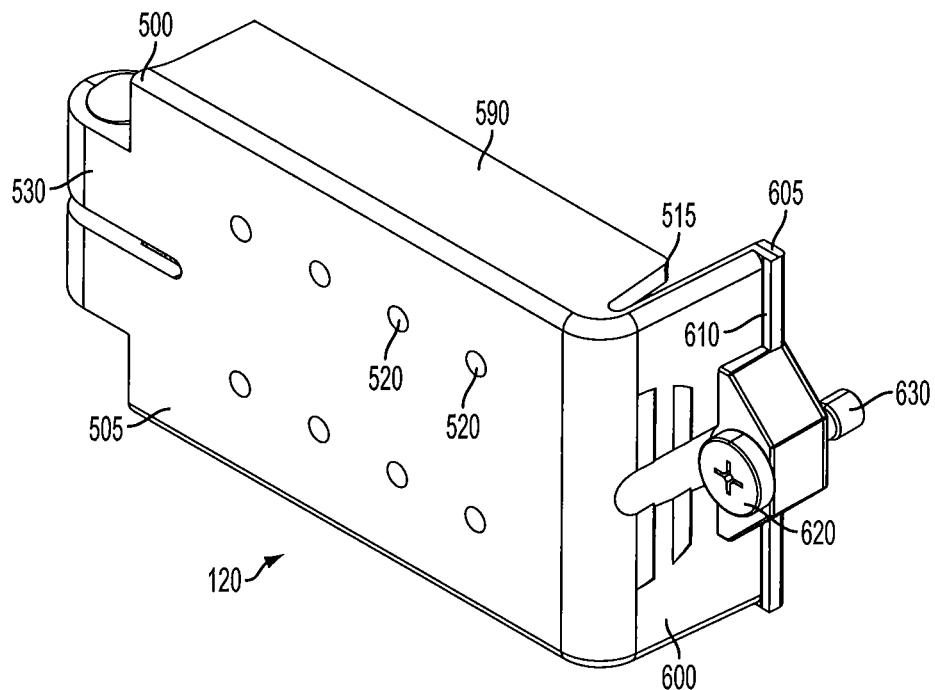
FIGS. 13A-13B illustrate perspective views of one embodiment of a cover of one embodiment of the terminal block system of FIG. 1.
Figure 13B:
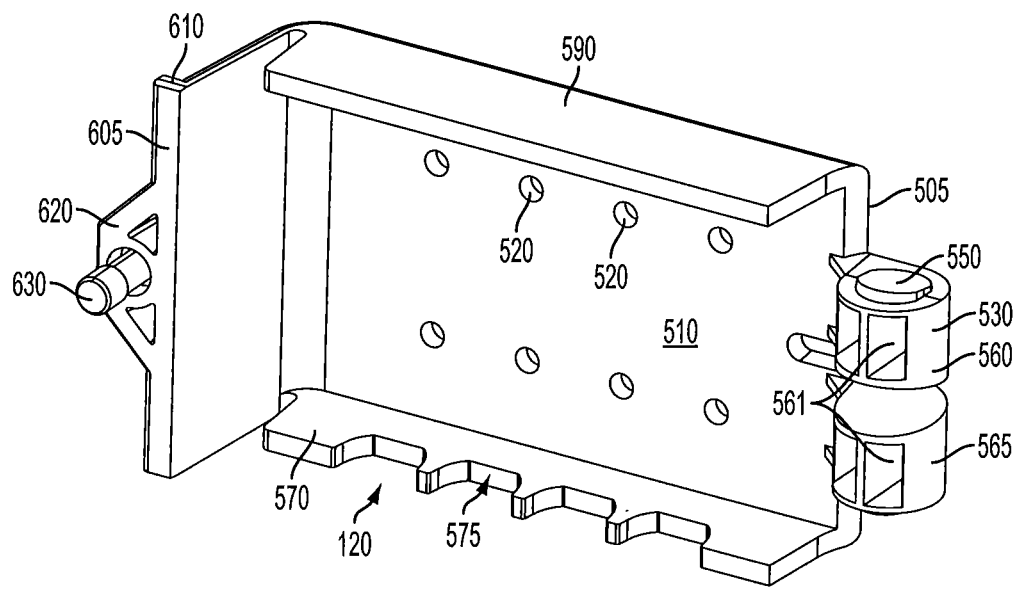

FIGS. 13A-13B are perspective views of the cover 120 of the terminal block system 105. FIGS. 14, 15, 16, and 17 are front, bottom, and side views, respectively, of the cover 120 in FIGS. 13A-13B. The cover 120 can have a cover body 500 in the shape of plate that is shown in the figures oriented in a vertical direction. The cover body 500 includes a first cover surface 505 that is faces away from the first housing surface 205 and a second cover surface 510 (shown in FIG. 2), opposite the cover first surface 505, that faces toward the first housing surface 205. The first and second cover surfaces 505, 510 can be separated by a web thickness. The general shape of the cover body 500 can be many shapes, but is preferably shaped and sized to at least cover the terminal block 125 mounted within the main housing. In one example, the cover body shape is rectangular. The cover body 500 can have a first cover end 512 and a second cover end 514, opposite the first cover end 512, and a third cover end 516 and a fourth cover end 518, opposite the third cover end 516. The first and second cover ends generally make up the sides, e.g., the vertical sides, that are associated with the height of the cover, while the third and fourth cover ends generally make up the sides, e.g., the horizontal sides, that are associated with the width of the cover.

A plurality of probing ports 520 (e.g., eight probing ports) can be formed in the cover body 500, extending between the first and second cover surfaces 505, 510. The probing ports 520 are sized to receive a pin probe, such as up to 0.1 inch (2.5 mm) in diameter, that is used to test and verify the voltage of the first electrical ports 440 of the terminal block 125, when the cover is in the closed position. The probing ports 520 can be small enough to prevent any body contact, such as finger contact, from the end user. The number and location of the probing ports can correspond to the number and location of the first electrical ports such that each first electrical port is accessible with a single probing port.

Along the first cover end 512 of the cover body 500 is a finger hinge segment 530 that is configured to hingedly attach to the first and second ear portions 242, 244 of the first housing sidewall 230. The finger hinge segment 530 can extend laterally outward from the first cover end 512 of the cover body 500, and may be centrally located on the first cover end 512. The finger hinge segment 530 is sized and shaped to fit within the indentation 240 of the first housing sidewall 230. To this end, the notches areas 535 surround the finger hinge segment 530 along the first cover end 512, which can be sized to receive corresponding first and second ear portions 242, 244. The finger hinge segment 530 can having a first engaging end 540 and a second engaging end 545, opposite the first engaging end 540, for coupling to corresponding first and second ear portions 242, 244. A hinge protrusion 550 can be disposed on the first and second engaging ends 540, 545. The hinge protrusion 550 is sized to within the hinge bores 246 of the corresponding first and second ear portions 242, 244 to define a pivot axis for the cover 120 to move between the open and closed positions.

Figure 14:
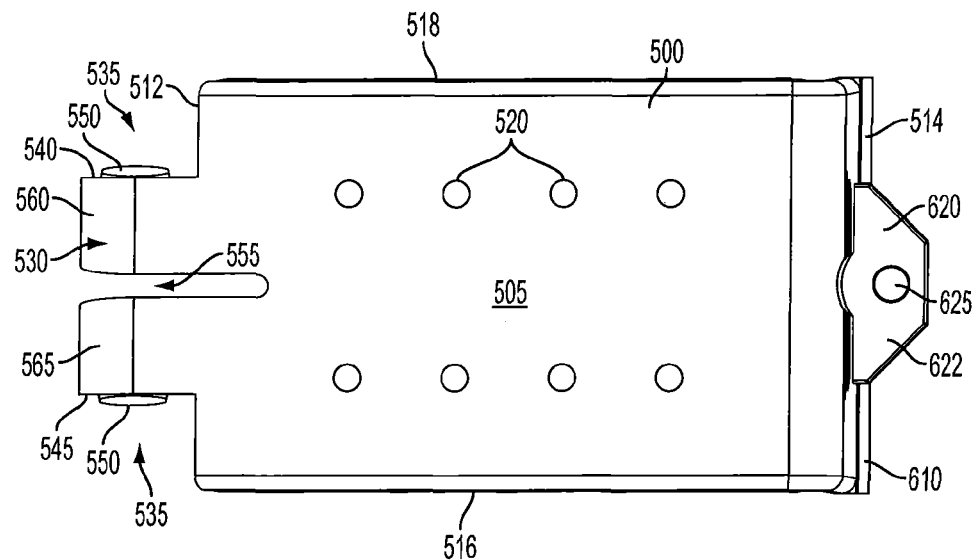
FIG. 14 illustrates a front view of one embodiment of the cover of FIG. 13A.
Figure 17:
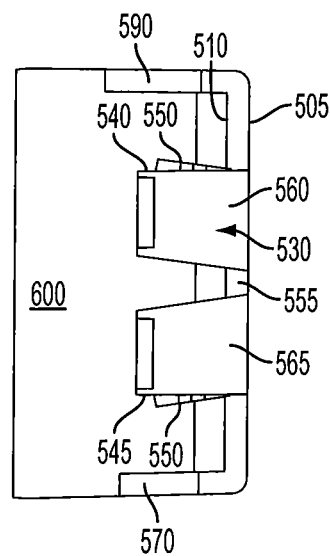
FIG. 17 illustrates another side view of one embodiment of the cover of FIG. 13A.

A dividing slot 555 may be formed in an intermediate region of the finger hinge segment to divide the finger hinge segment 530 into a first finger segment 560 and a second finger segment 565. The dividing slot 555 can be oriented generally horizontal with respect to the cover body 500. In FIG. 14, the dividing slot 555 may extend laterally into the cover body 500 beyond the first cover end 512. In FIG. 17, the width of the dividing slot 555 may taper along the inner ends of the finger segments 560, 565. The length and width of the dividing slot 555 is configured to permit the first and second finger segments 560, 565 to be resiliently displaced to an insertion position from an engaged position. In the insertion position, the first and second finger segments 560, 565 are brought closer to one another by application of opposable forces. In one example, the opposing forces can be applied to recesses 561 formed in the inner side of the first and second finger segments 560, 565 to move the finger segments into a smaller profile for insertion into the indentation 240 of the first housing sidewall 230. Upon release of the opposable forces and insertion of the first and second finger segments 560, 565 into the indentation 240, the first and second finger segments 560, 565 can return to the engaged position where the hinge protrusions 550 are introduced to the hinge bores 246 of the first and second ear portions to snap into engagement. As a result, a hinge connection is formed between the main housing and the cover.

The hinge connection between the main housing and the cover is configured to inhibit the removal of the cover from the main housing when the cover is in the closed position. For instance, the outer portions of the finger segments are brought into an abutting relationship with the inner portions of the ear portions. In another example, the hinge connection between the main housing and the cover is configured to allow for the removal of the cover from the main housing when the cover is in the open position. In one example, the outward surface of the hinge protrusion 550 may further be shaped to prevent removal of the cover from the hinge side when the cover is in the closed position. In other words, the cover can be configured to be installed and/or removed from the hinge side when the cover is in the wide-open position to access the recesses 561. In FIG. 17, the outward surface may be beveled from one end of the hinge protrusion to the surface of the finger segment, at an angle in a direction from the second cover surface to the first cover surface.

A first cover sidewall 570 can extend outward away from the second cover surface 510 of the cover body 500 along the third cover end 516. The first cover sidewall 570 can be sized to extend horizontally at least partially between the first and second cover ends 512, 514. A plurality of second notches 575 (e.g., four second notches) can be formed in a first end 572 of the first cover sidewall 570. Each of the second notches 575 may have an arcuate portion 576 having a second radius of curvature R2. In one example, the second notch 575 can have a linear portion 778 to flatten the arcuate portion 576. The linear portion 778 can be substantially parallel with the second cover surface.

Figure 16:
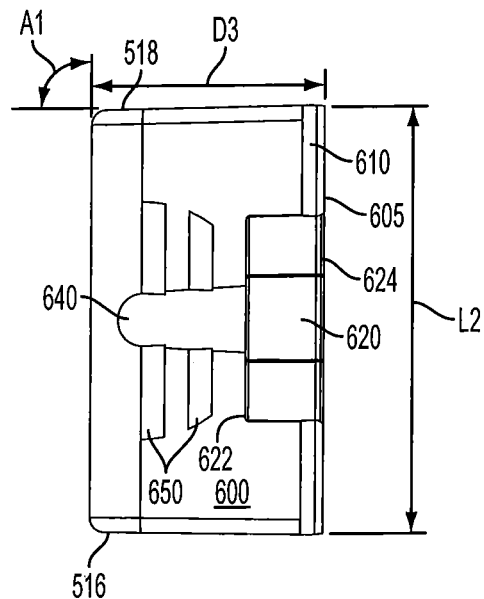
FIG. 16 illustrates a side view of one embodiment of the cover of FIG. 13A.

A second cover sidewall 590 can extend outward away from the second cover surface 510 along the fourth cover end 518. At least one of the first and second cover sidewalls 570, 590 can be obliquely angled relative to the first cover surface by an angle A1 of about 90-95 degrees, as shown in FIG. 16. The second cover sidewall 590 can be sized to extend horizontally at least partially between the first and second cover ends 512, 514. In one example, the end of the second cover sidewall 590 and the second cover end 514 may have a spacing 515 therebetween to permit the second cover end to move inwardly relative the third and fourth cover ends. The length of extension of the second cover sidewall 590 away the second cover surface 510 is long enough so that power entry can be solely from the first cover sidewall side. The extension length of the second cover sidewall can be long enough to engage the first housing surface 205 when the cover 120 is in the closed position. In one example, the extension length of the second cover sidewall 590 away the second cover surface 510 can be sufficiently long to permit flexing in response to inward forces along the first and second cover ends. FIG. 3 illustrates the extension length of the second cover sidewall 590 may leave a top gap 592 between the end 594 of the second cover sidewall 590 and the first housing surface 205. However, any external penetration from the top gap 592 can be inhibited due to the external surface 596 of the body of the terminal block 125 when the cover is in the closed position.

Figure 15:
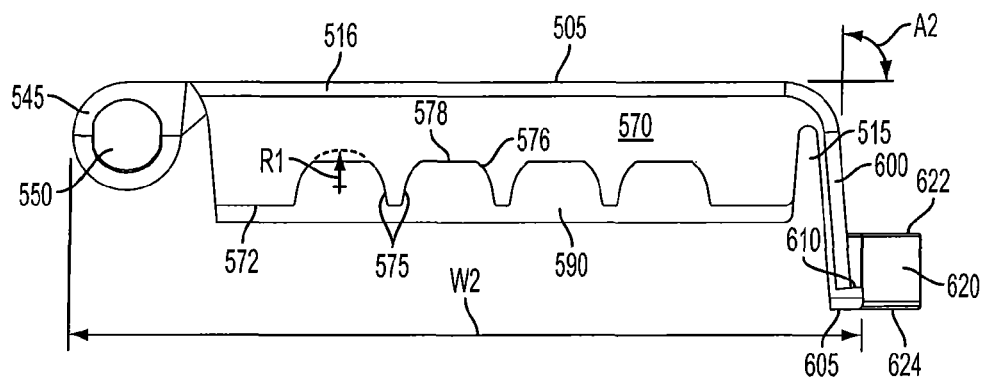
FIG. 15 illustrates a bottom view of one embodiment of the cover of FIG. 13A.

A third cover sidewall 600 can extend outward away from the second cover surface 510 along the second cover end 514. The third cover sidewall 600 can obliquely angled relative to the first cover surface by an angle A2 of about 90-100 degrees, as shown in FIG. 15. The third cover sidewall 600 can be sized to extend vertically at least partially between the third and fourth cover ends 516, 518. The length of extension of the third cover sidewall 600 away the second cover surface 510 can be long enough so that an engageable end 605 of the third cover sidewall can engage the first housing surface 205 when the cover 120 is in the closed position. FIG. 15 depicts the extension length of the third cover sidewall 600 being generally longer than the respective extension lengths of the first and second cover sidewalls 570, 590. A lip 610 can be formed proximate the engageable end 605 along the exterior surface of the third cover sidewall 600. The lip 610 can be securely engaged with the engaging tip 284 of the snap tang retainers 280 of the main housing 110 when the cover is in the closed position.

A second tongue member 620 can protrude laterally outward away from the third cover sidewall 600. The second tongue member 620 can have a first confronting surface 622 and a second confronting surface 624 that can be coextensive with the engageable end 605. A second locking bore 625 can be formed in an intermediate portion of the second tongue member 620, extending between the first and second confronting surfaces 622, 624. When the cover 120 is in the closed position, the second confronting surface 624 of the second tongue member 620 can engage the first confronting surface 272 of the first tongue member 270. Further, the second locking bore 625 can be in communication with the first locking bore 275 in order for both to receive a locking fastener 630, such as a threaded screw or a captive spinning clinch bolt, for secure attachment between the cover 120 when in the closed position and the main housing 110. A first groove 640 can be formed in the third cover sidewall 600 to allow clearance for the head of the locking fastener 630. One or more second grooves 650, generally transverse to the first groove 640, can be formed in the third cover sidewall 600 to improve grippability of the cover when being moved between the open and closed positions.

Figure 18:
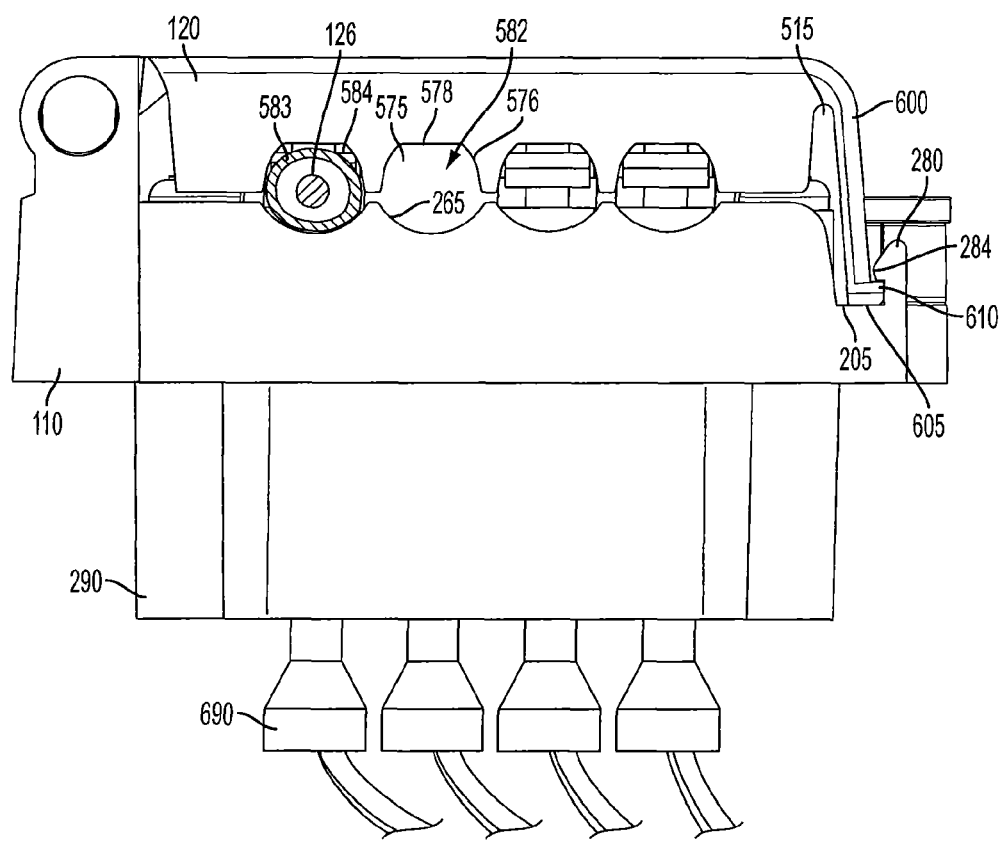
FIG. 18 illustrates a bottom view of one embodiment of a main housing coupled to a cover.

In FIG. 18, the second notches 575 can be arranged to cooperatively interface with corresponding first notches 265 of the second housing sidewall 260 of the main housing 110 to define a passageway 582 for external wires that are coupled to the terminal block. The second notch 575 can be disposed relative to the corresponding first notch 265 to capture the external wire 126 that is inserted through the passageway 582. The external wire 126, or the plastic wire housing 583 surrounding the wire, can have a curved and/or flattened cross-section, such as ovalic or elliptical cross-section, due to crimping with pliers. In one example, the first radius of curvature R1 of the first notch 265 is greater than the second radius of curvature R2 of the second notch 575. The linear portion 578 can further reduce the remaining space 584 of the passageway 582 surrounding the external wire 580. As a result, a wire of a suitable gauge, such as, for example, about 16 to 14 AWG wires and appropriate terminals for AC or high-voltage DC power supply, or about 12 to 10 AWG wire and appropriate terminals for the low-voltage DC power supply, is inserted through the passageways and the cover is closed. The notches can be sized and shaped to prevent a 2.5 mm probe from penetrating the main housing through the passageways and around the inserted wires and wire housing.

The main housing 110 and/or the cover 120 can be made from a dielectric, or electrically insulating, material. Exemplary materials include, but are not limited to, urea polymers, thermoplastic polymers such as nylons, polyesters, particularly polyethylene terphthalate (PET), polyester containing copolymers such as PET copolymers, polyolefins, ethylene vinyl alcohol copolymers, acrylonitrile copolymers, acrylic polymers, vinyl polymers, polycarbonate, polystyrene, polyurethanes, and combinations thereof. Other materials can include polyvinyl chloride (PVC), as well as resins containing high impact amorphous polycarbonate (PC) and acrylonitrile-butadiene-styrene (ABS) terpolymer blends, such as CYCOLOY® 2950HF from GE Plastics, which can be highly resistant to heat and inflammable. The main housing 110 and/or the cover 120 may be formed using various processes, including but are not limited to, thermoforming, blow molding and injection molding.

In one example embodiment, the main housing is a molded part made of CYCOLOY material. The width W1 of the main housing between the end of the first housing sidewall and the second housing end is about 3.0 inches, and preferably about 2.8 inches. The height L1 between the third housing end and the fourth housing end is about 1.5 inches, and preferably about 1.4 inches. The terminal block openings, eight in total, have a diameter of about 0.33 inches, spaced laterally from one another by a distance of about 0.375 inches, and spaced vertically from one another by a distance of about 0.64 inches. The extension length D1 of the shroud is about 0.75 inches, and the extension length D2 of the first housing sidewall from the second housing surface is about 1.03 inches. The cover is a molded part made of CYCOLOY material. The width W2 of the cover between the end of the finger hinge segment and the second cover end is about 3.0 inches, and preferably about 2.75 inches. The height L2 between the third cover end and the fourth cover end is about 1.5 inches, and preferably about 1.4 inches. The probing ports, eight in total, have a diameter of about 0.095 inches, spaced laterally from one another by a distance of about 0.375 inches, and spaced vertically from one another by a distance of about 0.64 inches. The extension length D3 of the third cover sidewall is about 0.79 inches, the extension length of the first cover sidewall from the first housing surface is about 0.4 inches, and the extension length of the second cover sidewall from the first housing surface is about 0.49 inches. Any dimensions described in the specification are for illustrative purposes only.

Figure 19:
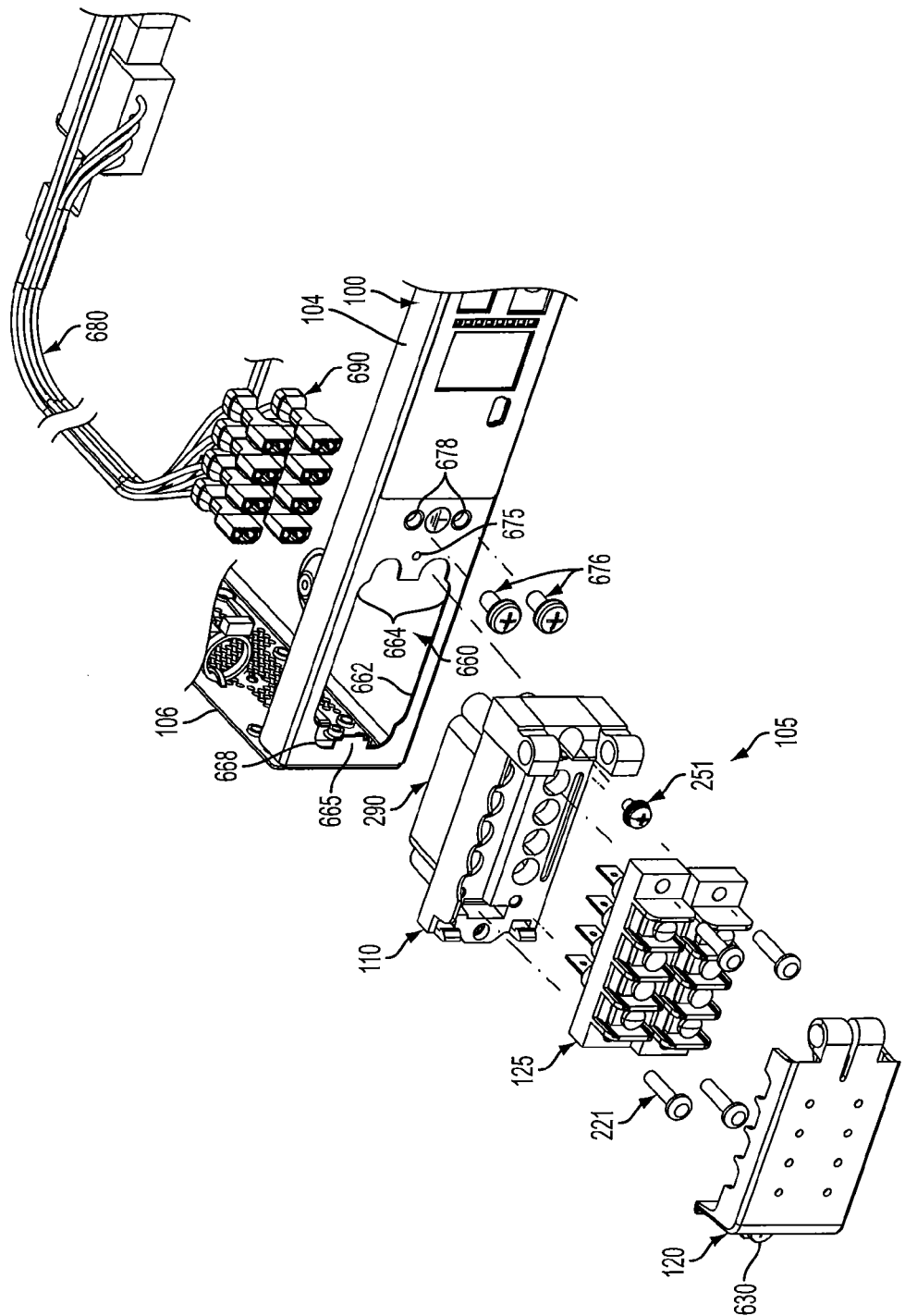
FIG. 19 illustrates an exploded perspective view of the components of one embodiment of the terminal block system mounted to the electrical component of FIG. 1.

FIG. 19 illustrates an exploded perspective bottom view of one example of the terminal block system 105 and the electrical component 100. The chassis sidewall 104 of the electrical component has a housing cutout 660 formed therein, sized to receive the shroud 290 of the main housing 110. The housing cutout 660 includes an inner edge 662 that defines a shape substantially identical to the shape of the outer periphery of the shroud 290 and/or tubular members 310 of the main housing 110. For example, the housing cutout 660 has two opposable linear portions 664 extending horizontally. A chassis sidewall locking tab 665 can extend from the chassis sidewall, inward into the housing cutout 660 to be insertable into the gap 320 between the tubular members 320. In one example, the locking tab 665 can be sized to be insertable into the opening 324 of the connecting wall 322 to at least partially retain the main housing within the cutout. Curved portions 668 can be formed adjacent the locking tab 665 to receive the tubular members. The housing cutout 660 and the shroud 290 are configured such that the shroud is movable within the housing cutout between a free position for insertion or removal of the main housing and a retained position. In the retained position, the shroud 290 is moved to a position where the locking tab 665 of the inner edge 662 securely engages into the opening 324 of the main housing. The terminal block 125 can coupled to the first surface of the main housing 110 with terminal block fasteners 221 being inserted though the fastener openings and tubular members. For example, the second electrical connectors can be inserted through the terminal block openings in order to be accessible from the side of the shroud. A ground wire can be attached proximate the terminal block system 105 to ground the system and the electrical component. For example, a first end of a ground wire, such as a 6-gauge ground wire, can be attached to the chassis sidewall 104 with one or two ground screws 676 that are inserted into ground openings 678 formed in the chassis sidewall 104. The first end may be attached to a terminal lug, such as a dual-hole terminal lug. The second opposite end of the ground wire is attached to a grounded bare metal surface, such as a ground bus or a grounded bare rack. The distance between the ground terminations and the VAC hot/neutral can be at least about 0.34 inches (8.55 mm).

Figure 20:
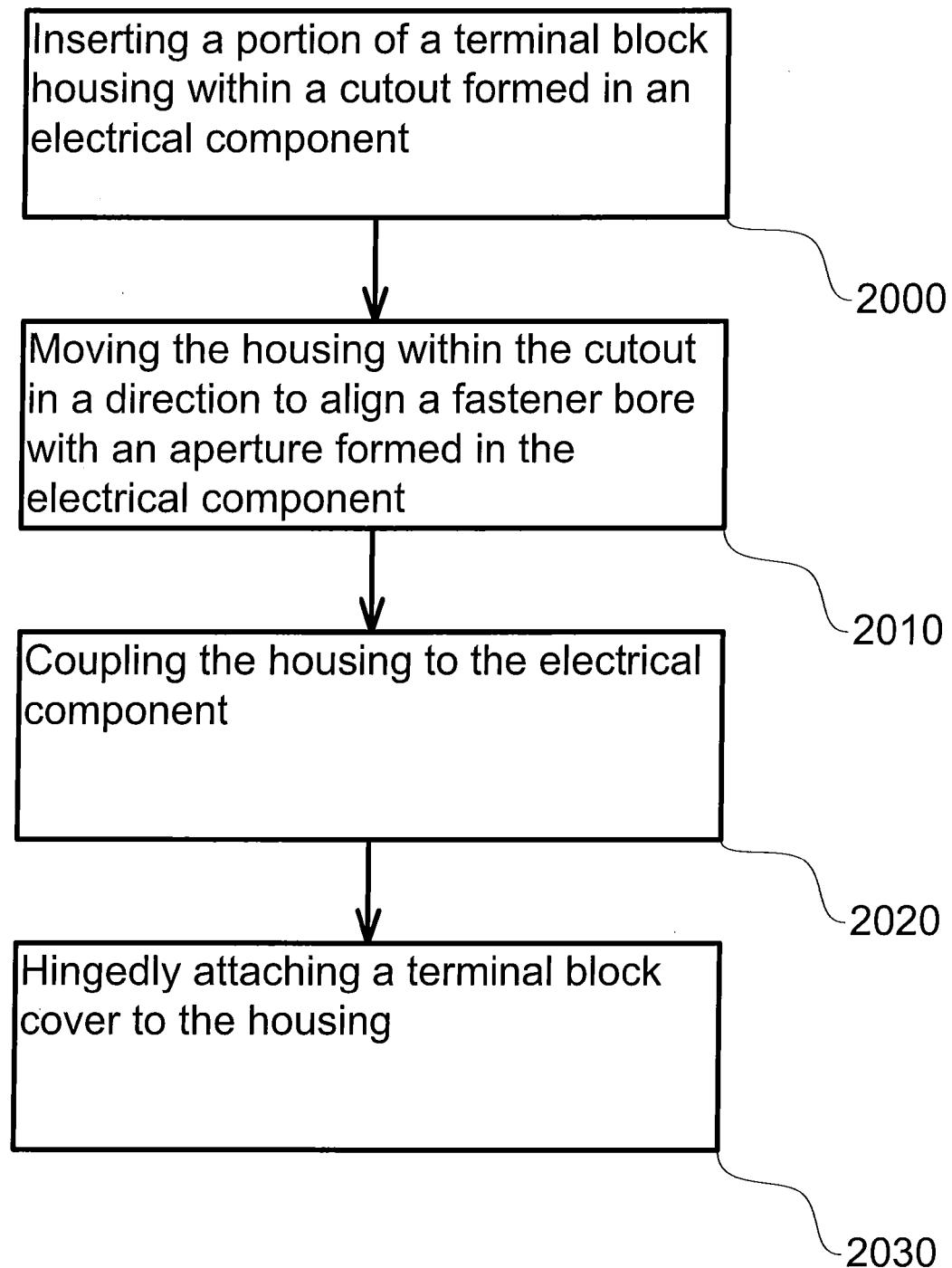
FIG. 20 illustrates a flow chart of one embodiment of a method of assembling a terminal block system and an electrical component.

FIG. 20 illustrates a flow chart of a method of assembling of the terminal block system 105 and the electrical component 100. The method can be implemented in the order of steps shown, but other sequences of steps may be also be used. Further, different, fewer or more acts may be provided.

At block 2000, a portion of the main housing 110, such as the shroud 290, can be inserted within the housing cutout 660 formed within the chassis sidewall 104 of the electrical component 100. The second housing surface 210 of the main housing 110 can be flush against the chassis sidewall 104 of the electrical component.

At block 2010, the main housing 110 can be moved laterally within the housing cutout 660, e.g., up to about 0.25-inch to about 0.5-inch, in a direction so that an aperture 675 formed in the chassis sidewall is in alignment with the fastener bore 250. At this position, the main housing and the housing cutout are configured so the main housing is retained within the housing cutout. For example, the chassis sidewall locking tab 665 is inserted within the opening 324 of the main housing. In one the example, the main housing is slid away from the aperture to a position such that the fastener bore 250 of the main housing 110 is in alignment with the aperture 675 of the chassis sidewall 104. It is contemplate that the main housing can be slid toward the aperture for locking the housing within the cutout.

At block 2020, the main housing 110 can be coupled to the electrical component 100. For example, the retainer fastener 251 can be inserted through the fastener bore 250 and the aperture 675 to securely attach the main housing to the electrical component. In one example, the main housing and the electrical component are attached with a single fastener, such as the retainer fastener. The electrical component can have one or more internal power wires 680, which may have connectors 690 that are configured to couple to the second electrical ports of the terminal block 125 located within the shroud 290. The connectors 690 can then be coupled to the second electrical ports. The internal power wires may be connected between the terminal block and a power consumer component, such as a motherboard, of the electrical component. A ground wire can be attached to the chassis sidewall 104 by attaching the first end of the ground wire to the ground screws 676 and tightening the ground screws within the ground openings 678.

At block 2030, the cover 120 can be hingedly attached to the main housing 110 that is fixed to the electrical component. With the cover oriented in a wide-open position, the first and second finger segments of the finger hinge segment of the cover can be brought closer to one another by application of opposing forces at the first and second engaging ends. As a result, the first and second finger segments are urged to a smaller profile for insertion into the indentation of the first sidewall of the main housing. Upon release of the opposing forces and insertion of the first and second finger segments into the indentation, the first and second finger segments can return to the engaged position where the hinge protrusions are introduced to the hinge bores of the first and second ear portions to snap into engagement. Consequently, the cover can be pivoted between the open and closed positions. External power wires, such as external wires 126 in FIG. 2, can be brought vertically form the side of the first notches and second notches. The ends of the external power wires can be configured, e.g., pigeonhole or hoop arrangement, for securely attaching to the first electrical ports of the terminal block when the cover is in the open position.

After voltage is tested and verified successfully to suitable connections to the terminal block, the cover can be move to the closed position. The engageable end of the third cover sidewall of the cover can engage the retainers on the main housing on the way to the closed position. This engagement can urge the retainers to pivot outwardly until the engageable end contacts the first housing surface of the main housing, after which the retainers resiliently return to the engaged position. As a result, the engaging tips of the retainers are positioned to capture the lip in order to retain the cover in the closed position. The second confronting surface of the second tongue member of the cover can engage the first confronting surface of first tongue member 270 so that the second locking bore is in communication with the first locking bore. This alignment can permit the locking fastener 630 to be moved to the locking configuration for secure attachment between the cover and the main housing. When the cover is in the closed position, power can be tested and verified by using a pin probe that can be inserted through the probing ports of the cover.

To move the cover to the open position, the locking fastener 630 can be moved to the unlocking configuration to permit the cover to be disengaged from the main housing. The end user can apply an inner force along an intermediate region of the third cover sidewall of the cover to displace the lip to a position to clear the engaging tips of the retainers. The spacing 515 formed in the cover 120 may facilitate inward displacement of the third cover sidewall and the lip. As mentioned previously, the first and second sidewalls of the cover can be configured to flex inwardly or outwardly to facilitate displacement of the lip. After sufficient clearance, the cover can pivot to the open position.

The main housing and the cover for the terminal block can meet one or more power safety spacing and physical security requirements. The main housing is configured to separate the external and internal power from the chassis of the electrical component, and to separate the external and internal power from each other. The extension length of the shroud and the terminal block with the offset may also achieve meeting these requirements. The sidewalls of the housing, together with the sidewalls of the cover, can be configured for physical security, such as at least one of a retainable cover, a tool required to open a lockable cover to access the terminal block, and a lack of openings that are sized to allow a 2.5 mm diameter probe from access the terminal block when the cover in the closed position. The terminal block can be configured for a variety of power options, such as high VAC or VDC, high VAC or VDC and low VDC, or any combination thereof and/or redundant power. The entire assembly of the housing with the terminal block and the cover can be securely attached to the chassis of the electrical component with a single fastener to reduce manufacturing costs. The mounting footprint of the terminal block system can be sized to fit an electrical component having a 1RU size.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. An apparatus comprising:
a housing comprising a plate having a first housing surface and a second housing surface opposite to the first housing surface, a recessed portion of the first housing surface being recessed relative to an adjacent portion of the first housing surface, the first housing surface being configured to receive a terminal block to transmit power to an electrical component, the terminal block being configured to be attached to the recessed portion and the adjacent portion such that a first terminal block portion is offset relative to a second terminal block portion, the housing further comprising a first housing sidewall extending away from the first housing surface, at least one first notch formed in the first housing sidewall, and a shroud extending away from the second housing surface, the shroud configured to be inserted within the electrical component; and
a cover having a first cover surface and a second cover surface opposite the first cover surface to face the first housing surface, a cover sidewall extending away from the second cover surface, at least one second notch formed in the cover sidewall,
wherein the cover is configured to hingedly attach to the housing, and the cover is movable relative to the housing between a closed position and an open position,
wherein, in the closed position, the cover and the housing together form an enclosure for the terminal block, and the at least one first notch and the at least one second notch cooperatively define at least one passageway configured to receive at least one external wire to connect to the terminal block,
wherein the cover is configured to hingedly attach to the housing with a hinge connection configured to inhibit removal of the cover from the housing when the cover is in the closed position and enable removal of the cover from the housing when the cover is in the open position,
wherein the housing comprises a second housing sidewall extending from the first housing surface, and an indentation formed in the second housing sidewall to form a first ear portion and a second ear portion to define a portion of the hinge connection, and the cover comprises a finger segment extending within the indentation of the housing to form the hinged connection between the first and second ear portions of the housing and the finger segment of the cover,
wherein the finger segment of the cover comprises a hinge protrusion for insertion into bores extending within the respective first and second ear portions of the housing,
wherein the finger segment of the cover comprises a first finger segment and a second finger segment that are configured for resilient displacement relative to one another, and
wherein at least one of the first finger segment or the second finger segment comprises a recess formed in an inner side of the respective first finger segment or second finger segment, and the recess is inaccessible when the cover is in the closed position to inhibit removal of the cover from the housing and accessible when the cover is in the open position to enable removal of the cover from the housing.

2. An apparatus comprising:
a housing comprising a plate having a first housing surface and a second housing surface opposite to the first housing surface, a recessed portion of the first housing surface being recessed relative to an adjacent portion of the first housing surface, the first housing surface being configured to receive a terminal block to transmit power to an electrical component, the terminal block being configured to be attached to the recessed portion and the adjacent portion such that a first terminal block portion is offset relative to a second terminal block portion, the housing further comprising a housing sidewall extending away from the first housing surface, at least one first notch formed in the housing sidewall, and a shroud extending away from the second housing surface, the shroud configured to be inserted within the electrical component; and
a cover having a first cover surface and a second cover surface, opposite the first cover surface, to face the first housing surface, a cover sidewall extending away from the second cover surface, at least one second notch formed in the cover sidewall,
wherein the cover is configured to hingedly attach to the housing, and the cover is movable relative to the housing between a closed position and an open position,
wherein, in the closed position, the cover and the housing together form an enclosure for the terminal block, and the at least one first notch and the at least one second notch cooperatively define at least one passageway configured to receive at least one external wire to connect to the terminal block,
wherein the first terminal block portion comprises at least one first electrical port configured to engage a first external wire external of the electrical component and at least one second electrical port configured to engage a first internal wire within the electrical component to electrically couple the first external wire and the first internal wire, the second terminal block portion comprises at least one first electrical port configured to engage a second external wire external of the electrical component and at least one second electrical port configured to engage a second internal wire within the electrical component to electrically couple the second external wire and the second internal wire, and the terminal block is configured to be coupled to the first housing surface such that the at least one first electrical port of the second terminal block portion is positioned closer to the second cover surface than the at least one first electrical port of the first terminal block portion with the cover in the closed position.

3. The apparatus of claim 2, wherein the at least one first notch and the at least one second notch are each configured to reduce spacing around external wires when inserted in the at least one passageway.

4. The apparatus of claim 3, wherein at least one of the at least one first notch or the at least one second notch comprises an arcuate portion, and at least one of the at least one first notch or the at least one second notch comprises a linear portion substantially parallel to the respective first housing surface or the second cover surface.

5. The apparatus of claim 2, wherein the cover sidewall is a first cover sidewall, and the cover comprises a second cover sidewall extending away from the second cover surface, substantially transverse to the first cover sidewall, the second cover sidewall having a length greater than the first cover sidewall.

6. The apparatus of claim 5, wherein the second cover sidewall is movable inward relative to the first cover sidewall when the cover is in the closed position.

7. The apparatus of claim 2, wherein the cover is hingedly attached to the housing with a hinge connection configured to inhibit removal of the cover from the housing when the cover is in the closed position and enable removal of the cover from the housing when the cover is in the open position.

8. The apparatus of claim 7, wherein the housing sidewall comprises a first housing sidewall, the housing comprises a second housing sidewall extending from the first housing surface, and an indentation formed in the second housing sidewall to form a first ear portion and a second ear portion to define a portion of the hinge connection, and the cover comprises a finger segment extending within the indentation of the housing to form the hinged connection between the first and second ear portions of the housing and the finger segment of the cover.

9. The apparatus of claim 8, wherein the finger segment of the cover comprises a hinge protrusion for insertion into bores extending within the respective first and second ear portions of the housing.

10. The apparatus of claim 9, wherein the finger segment of the cover comprises a first finger segment and a second finger segment that are configured for resilient displacement relative to one another.

11. The apparatus of claim 10, wherein the first finger segment and the second finger segment are configured to move to close proximity to one another upon application of opposing forces on the inside of the first and second finger segments.

12. The apparatus of claim 10, wherein at least one of the first finger segment or the second finger segment comprises a recess formed in an inner side of the respective first finger segment or second finger segment, wherein the recess is inaccessible when the cover is in the closed position to inhibit removal of the cover from the housing and accessible when the cover is in the open position to enable removal of the cover from the housing.

13. The apparatus of claim 2, wherein the cover in the closed position is secured to the housing, the cover being configured to be released from the closed position with a tool.

14. The apparatus of claim 2, further comprising at least one first terminal block opening extending between the recessed portion of the first housing surface and the second housing surface and at least one second terminal block opening extending between the adjacent portion of the first housing surface and the second housing surface, the at least one first terminal block opening configured to receive the first terminal block portion, and the at least one second terminal block opening configured to receive the second terminal block portion.

15. The apparatus of claim 14, wherein the at least one first terminal block opening comprises a first set of terminal block openings aligned in a first row along the recessed portion of the first housing surface and the at least one second terminal block opening comprises a second set of terminal block openings aligned in a second row along the adjacent portion of the first housing surface.

16. The apparatus of claim 15, wherein the at least one first notch of the housing comprises a set of first notches, the at least one second notch of the cover comprises a set of second notches, the at least one passageway comprises a set of passageways defined by the set of first notches and the set of second notches, and each passageway is aligned with a corresponding one of the first terminal block openings and a corresponding one of the second terminal block openings.

\* \* \* \* \*